United States Patent [19]

Jacobs

[11] Patent Number: 5,055,907
[45] Date of Patent: Oct. 8, 1991

[54] EXTENDED INTEGRATION SEMICONDUCTOR STRUCTURE WITH WIRING LAYERS

[75] Inventor: Scott L. Jacobs, Apex, N.C.
[73] Assignee: Mosaic, Inc., San Diego, Calif.
[21] Appl. No.: 301,972
[22] Filed: Jan. 25, 1989
[51] Int. Cl.$^5$ .......................................... H01L 23/48
[52] U.S. Cl. ...................................... 357/71; 357/68; 357/80
[58] Field of Search ...................... 357/67, 68, 65, 51, 357/71, 72, 80, 46

[56] References Cited

U.S. PATENT DOCUMENTS

| | | | |
|---|---|---|---|
| 4,580,156 | 4/1986 | Comizzoli | 357/530 |
| 4,617,730 | 10/1986 | Geldermans et al. | 29/843 |
| 4,648,179 | 3/1987 | Bhattacharyya et al. | 29/832 |
| 4,681,654 | 7/1987 | Clementi et al. | 156/630 |
| 4,695,870 | 9/1987 | Patraw | 357/74 |
| 4,698,662 | 10/1987 | Young | 357/80 |
| 4,705,205 | 11/1987 | Allen et al. | 228/180.2 |
| 4,714,516 | 12/1987 | Eichelberger et al. | 156/623 |
| 4,755,866 | 7/1988 | Marshall et al. | 357/81 |
| 4,766,670 | 8/1988 | Gazdik et al. | 29/830 |
| 4,783,695 | 11/1988 | Eichelberger et al. | 357/67 X |
| 4,890,157 | 12/1989 | Wilson | 357/80 |
| 4,958,222 | 9/1990 | Takakura et al. | 357/68 X |

OTHER PUBLICATIONS

Active Silicon Hybrid Wafer-Scale Packaging, Richard C. Jaeger, SRC Technical Report No. T86046.

Primary Examiner—William Mintel
Assistant Examiner—Roy Potter
Attorney, Agent, or Firm—Fleit, Jacobson, Cohn, Price, Holman & Stern

[57] ABSTRACT

A low cost, lightweight, fast, dense and reliable extended integration semiconductor structure is provided by forming a thin film multilayer wiring decal on a support substrate and aligning and attaching one or more integrated chips to the decal. A support ring is attached to the decal surrounding the aligned and attached integrated substrate, and the support substrate is removed. Reach-through vias connect the decal wiring to the chips.

44 Claims, 7 Drawing Sheets

EXTENDED INTEGRATION SEMICONDUCTOR STRUCTURE WITH WIRING LAYERS

FIELD OF THE INVENTION

This invention relates to the packaging of integrated circuit chips and more particularly to high density, high reliability, extended integration packaging of one or more integrated circuit chips.

BACKGROUND OF THE INVENTION

Advances in semiconductor fabrication technology have allowed Very Large Scale Integration (VLSI) and Ultra Large Scale Integration (ULSI) chips, having up to several million devices thereon, to be reliably and economically produced. As device densities increase and device sizes shrink, system performance is becoming more limited by the interconnection and packaging of the chips, and not by the internal circuitry of the chips themselves. For example, package limitations such as the maximum allowed number of chip input/output pads, have resulted in the inability to utilize all of the chip's capabilities. Multi-chip packaging generally requires wide spacing of chips to accommodate wiring channels, which results in longer wiring distances for chip interconnection, and leads to increased parasitic capacitance and a decrease in system speed. Moreover, complex packaging structures are inherently expensive and unreliable.

One high density packaging technique for integrated circuit chips is the multilayer ceramic substrate which is described, for example, in U.S. Pat. No. 3,993,123 to Hugh, et al. The multilayer ceramic substrate provides interconnections for about 100 integrated circuit chips and includes up to 33 internal wiring layers and about 1800 brazed input/output pins for connecting to a next level of packaging. Unfortunately, the multilayer ceramic substrate is extremely expensive to fabricate, and the fabrication methods employed limit the density of the substrate's internal wiring. Furthermore, the reliability of the chip to ceramic substrate interconnections (generally solder bumps or balls) degrades when small, high density interconnections are used because of thermal mismatches between the chips and substrate. Internal defects within the substrate wiring cannot be repaired once the substrate has been fabricated, so that additional engineering change (EC) wiring and pads must be included to provide acceptable yields.

One attempt to overcome the limitations of multilayer ceramic substrate technology has employed multilayer thin film wiring layers on top of a multilayer ceramic substrate. For example, U.S. Pat. No. 4,617,730 to Geldermans et al. provides thin film fine line metallization on one side of a support substrate. While thin film wiring layers may provide high density wiring for at least some of the chip packaging, the resulting structure is complex and costly. Furthermore, by forming the thin films on the substrate, the yield loses in the thin film layers are added to the yield losses in the substrate, thereby lowering overall yield. The underlying substrate also increases weight. Thin film technology has also been employed without the multilayer ceramic substrate in an attempt to provide improved packaging for integrated circuit chips. This technology employs thin film metallization techniques, similar to those employed on the chips themselves, for chip interconnection and packaging. One example of thin film technology for packaging is described in U.S. Pat. No. 4,714,516 to Eichelberger, et al., in which a thin film multilayer wiring structure is sequentially formed over a plurality of fully formed integrated circuit chips disposed adjacent one another on an underlying substrate. The thin film structure comprises alternating layers of polymer insulator and metal, which are formed, layer by layer, over the integrated circuit chips. Unfortunately, by forming the thin films on the chips, the yield losses in the thin film layers are added to the yield losses in the chips themselves, thereby lowering the overall yield of the whole. The package cannot easily be tested until it is fully completed, and the underlying substrate increases weight and makes heat removal more difficult. Furthermore, cycle time for completing the package is impacted because the chips and thin films cannot be produced in parallel. The crude alignment of the chips with respect to one another dictates that each and every grouping of chips needs to be mapped so the discretionary or individually customized interconnection patterns may be made by software driven, direct write techniques.

Yet another attempt at using thin film technology is disclosed in "Active Silicon Hybrid Wafer Scale Packaging" by Richard C. Jaeger (SRC Technical Report No. T86046, June 1986) in which pre-tested integrated circuit chips are mounted onto holes etched in a silicon wafer and conventional multilayer thin film metallization links are built to connect the chip pads to interconnection lines prebuilt in channels between the chips on the silicon wafer. Like the Eichelberger et al. patent, this approach requires customized links and discretionary lithography to align the chips to the wafer. Finally, the wiring channels are limited to the spaces between the chips, decreasing density and wiring capability.

Decal technology has also been employed in an attempt to provide improved integrated circuit packaging. In this technology, a thin film decal is formed on a first surface, and then transferred onto a chip or packaging substrate. One attempt to use decals for chip interconnection is disclosed in U.S. Pat. No. 4,755,866 to Marshall, et al. in which an array of high density chips include a plurality of decals, each of which overlies a single chip and part of the adjacent chip. The chips are directly connected to a frame or heat sink. Unfortunately, the use of multiple decals creates alignment, assembly and repair problems.

Wafer Scale Integration (WSI) technology has attempted to overcome many of the limitations of high density packaging by wiring circuits to the fullest possible extent on a processed substrate (a wafer). WSI has not been a commercial success, notwithstanding a large industry investment, because integrated circuit yields decrease dramatically as circuit count increases. Elaborate redundancy schemes have been devised for yield improvements, but these redundant circuits tend to eliminate the economic and performance advantages of WSI. Furthermore, in order to utilize the larger number of circuits on a wafer, additional wiring levels for long range signals need to be fabricated on the wafer, which further degrades yield and impacts the time to make a complete package.

The above survey indicates that the art has yet to find a low cost, lightweight, fast, dense and reliable packaging technique for integrated circuit chips.

SUMMARY OF THE INVENTION

It is therefore an object of the present invention to provide a low cost, lightweight, fast, dense and reliable chip package and a method of making the same.

It is another object of the present invention to provide a chip package in which tightly packed chips having electrically efficient interconnection therebetween behave like a single "extended integration" chip.

It is still another object of the present invention to provide an extended integration structure employing thin film decal technology for chip interconnection.

It is yet another object of the invention to provide an extended integration structure in which yield problems in the thin films do not compound the yield losses of the chips themselves.

It is yet another object of the invention to provide an extended integration structure in which the various parts may be fabricated separately and in parallel, to thereby decrease the total fabrication time for the structure.

It is yet another object of the invention to provide an extended integration structure which allows for repair during and after fabrication.

It is still another object of the invention to provide an extended integration structure which provides a low cost, lightweight, fast, dense and reliable package for single chips, arrays of chips or a wafer.

These and other objects are provided according to the present invention by a method of forming an extended integration semiconductor structure in which a support substrate, for example wafer-sized transparent glass, has formed thereon a thin film decal having one or more wiring layers separated by dielectric. In a preferred embodiment of the present invention the insulator is a transparent polymer, for example polyimide, and the thin film wiring layers are formed on the transparent support substrate one layer at a time. Each wiring layer may be tested after it is formed using well-known optical testing techniques, for example by shining light on the glass substrate, polyimide and wiring layer, and comparing the transmitted radiation with an expected pattern.

According to the invention, after the thin film decal has been formed on the support substrate, at least one integrated circuit chip is aligned to the thin film decal. Chip alignment may be performed using conventional optical alignment techniques through the transparent substrate and thin film decal. The aligned chip is attached to the thin film decal, and the aligning and attaching steps are performed for second and subsequent chips if desired. A support ring is then mounted on the thin film decal surrounding the aligned integrated circuit chips. Finally, the support substrate is removed, so that the decal is held under tension by the support ring. A plurality of vias, referred to as "reach-through vias" are formed through the newly exposed surface of the thin film decal to the integrated circuit chips, using lithographic or other techniques. These reach through vias selectively connect the decal wiring to pads on the integrated circuit chips.

An extended integration semiconductor structure is thereby formed, comprising a thin film decal having at least one wiring layer therein and a support ring which is attached to the decal and which maintains the decal under tension inside the support ring. At least one integrated circuit chip is attached to the decal inside the support ring, with the chip or chips being aligned to the decal. Reach-through vias form electrical connections between the wiring layer and the integrated circuit chips.

The present invention provides an interconnection and packaging technology which allows the chip manufacturer to "integrate" circuitry beyond the boundaries of the actual chips themselves. The extended integration structure creates a "virtual" large area chip which electrically behaves as if it were monolithic. The support substrate is only a temporary substrate for thin film processing, which is removed after mechanical chip attachment, leading to a thin, lightweight structure. Since no substrate is used, electrical and mechanical contacts to a next level of packaging may be made at all points on both sides of the structure. The usual vertical configuration of a semiconductor chip has not been altered.

The thin film decal is formed on the transparent substrate and may be tested layer by layer to promote high yields. Moreover, a defective decal may be tested and rejected or repaired before it is integrated to the chips so that the decal yields are decoupled from those of the chips. Testing of the decal and alignment of the chips may employ well known conventional optical techniques. Unlike electrical continuity testing, optical testing indicates the exact location of a defect, so that repair is facilitated. Customized alignment masks and/or direct writing lithography are not required. Parallel fabrication of the chips and decals keeps cycle time for package fabrication to a minimum.

Internal reach-through via connections are employed between the decal and the chip surface. The large area decal to chip connection with internal vias is subject to less mechanical stress than solder ball or other localized connection schemes, resulting in increased reliability. Spacing is held to an absolute minimum, and high input/output and dense wiring capability allow chip designs to "spill over" onto separate dies, without the need for output buffering devices such as slow, high power drivers. High speed is provided due to shortened signal paths. Material costs are negligible, with the support substrate being reusable. Since the design "ground rules" (such as minimum line width) for the decal will usually be more relaxed than that of the chip "ground rules", state of the art fabrication, testing and alignment equipment need not be used, resulting in low capital equipment cost. Accordingly, a low cost, lightweight, fast, dense and reliable extended integration structure is provided.

DETAILED DESCRIPTION OF THE INVENTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art. Like numbers refer to like elements throughout. For ease of illustration the thickness of layers has been exaggerated.

Figures 1A, 1B:
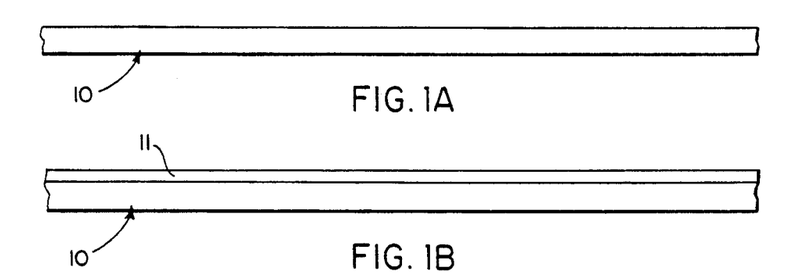
FIGS. 1A-1D illustrate a method of forming a thin film decal for an extended integration structure according to the present invention.

Referring now to FIG. 1, there is illustrated a method of forming a thin film decal for an extended integration semiconductor structure according to the present invention. FIG. 1A illustrates support substrate 10. Support substrate 10 is preferably a transparent piece of wafer-sized glass. A transparent substrate is employed so that optical alignment and testing techniques may pass light through the transparent substrate as will be described below. A wafer-sized substrate is preferably employed so that conventional lithographic, deposition, testing and other tools may be employed for processing. Referring now to FIG. 1B, a first insulating layer 11 preferably a transparent insulating layer of dielectric polyimide is deposited on substrate 10 using conventional techniques. Polyimide 11 may be DuPont 2525 polyimide manufactured by E.I. DuPont Nemoirs, or any other dielectric polyimide. The polyimide is then cured, for example by heating at 400° C. for 30 minutes.

Figure 1C:
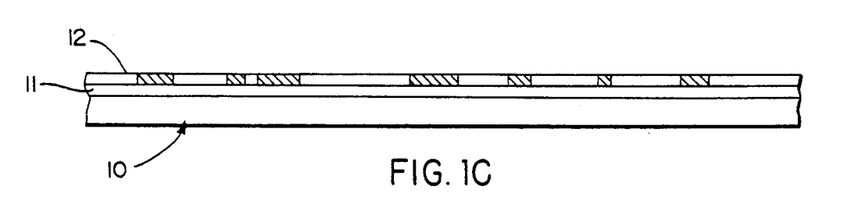

Referring now to FIG. 1C, a first wiring layer 12, preferably a patterned wiring plane of metal in polyimide dielectric, is formed on first insulating layer 11 using conventional thin film patterning and metallization techniques. A number of techniques for forming internal wiring layers will be described below in connection with FIG. 5. Metal layer 12 may be a conventional aluminum or copper wiring layer or preferably a more complex chromium clad copper or nickel clad copper layer. Since wiring layer 12 will connect input/output pads on chips, lower density ground rules may be used compared with chip metallization ground rules. For example, 2 $\mu$m ground rules may be employed compared with 1 $\mu$m or submicron chip ground rules, so that 1:1 projection lithography may be employed, using low cost tools. Typically dielectric layer 11 and wiring layer 12 are 1–3 $\mu$m thick to allow for low capacitance and high conductivity interchip wiring.

After first wiring layer 12 has been fabricated, it may be tested using conventional optical testing means, for example a KLA model 221 tester manufactured by KLA Corporation. Radiation is passed through support substrate 10, first insulating layer 11 and first wiring layer 12. The radiation pattern is detected by a diode array or other detection means, and compared to an expected pattern of radiation. In one embodiment, the transmitted radiation pattern is compared to an expected pattern stored in a database. In another embodiment, when multiple identical patterns are reproduced in the wiring, a pattern may be compared to its nearest neighbor and any differences may be detected. If the comparison indicates open or short circuits, the metallization may be repaired, the wiring layer may be discarded, or the defective portion may be registered so that it is not used later to form a completed structure. It will also be understood by those skilled in the art that mechanical probes may be employed for continuity testing, by providing probe pads in layer 12.

Figure 1D:
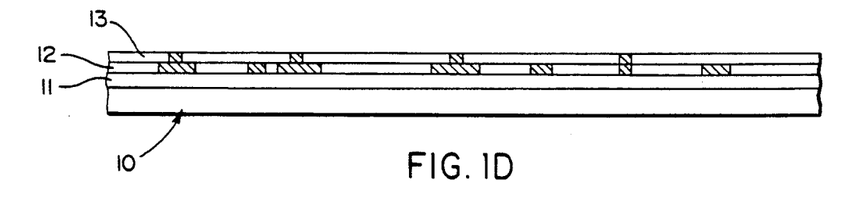

Referring now to FIG. 1D, a first internal via layer 13 is formed on first wiring layer 12. Internal via layers connect Wiring layers to one another. The process described in FIGS. 1B, 1C and 1D is then repeated to form the required number of internal wiring layers in the decal. If adhesion between dielectric layers is of concern, the polyimide in a previous layer may be partially etched away in a reactive ion etching process, to thereby undercut the metal in the wiring layer. When a next layer of polyimide is formed, the exposed undercut wiring layer provides a mechanical joint for the next layer of polyimide.

It will be understood by those having skill in the art that after a first wiring layer is formed and tested, second and subsequent wiring layers cannot be fully tested for internal shorts or opens using the optical technique described above. Since shorts or opens in subsequent wiring layers which are coincident with metal lines in first wiring layer 13 will not be revealed as defective, the smallest defects will escape the test procedure. However, in an actual decal, the area of the actual crossover points are a small fraction of the total pattern, so that in practice a very high percentage of the total wiring pattern may be optically tested.

Alternatively, if 100% testing of each layer is desired, each wiring layer may be fabricated in parallel on a separate substrate, and tested as was described in connection with FIGS. 1A–1C. After testing, each tested layer may be sequentially transferred onto first layer 12 to form the completed decals. Reach through vias may be formed to selectively connect the individual wiring layers.

Referring now to FIG. 2, a method of forming an extended integration semiconductor structure according to the present invention using the decal of FIG. 1 will be described. FIG. 2A illustrates thin film decal 15 which has been fully formed by repeatedly performing the process of FIGS. 1B–1D to build up an X wiring plane 16 an internal via layer 17, a Y wiring plane 18 and a ground plane 19, all within an insulator 20, for example polyimide. Polyimide 20 is transparent as is substrate 10, so that the entire structure of FIG. 2A is transparent except for the wiring layers. This will become important when aligning a chip to the substrate as will be described below.

Figure 2A:
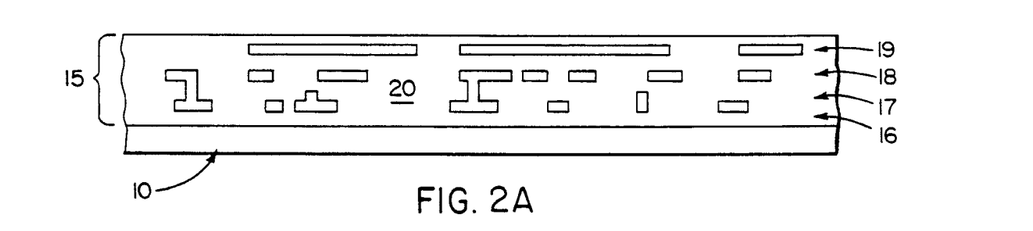
FIGS. 2A-2E illustrate a method of forming an extended integration semiconductor structure according to the present invention.

It will be understood by those having skill in the art that any number of internal wiring layers may be formed, in any order. However, in order to facilitate optical testing of the individual layers 16–19 as they are fabricated, it is preferred to fabricate ground plane 19 last because ground plane 19 is a continuous planar layer (except for a few alignment marks or windows) as opposed to a patterned wiring layer. If ground plane 19 is fabricated first, it is impossible to optically test the remaining wiring layers as they are fabricated. Fabricating ground plane 19 last also provides an electrical shield for the x and y wiring layers in the decal from the chips which are subsequently attached thereto. The shield prevents return currents from being set up in the semiconductor chips, resulting in slow wave propagation of the signals due to the imperfect dielectric or conductive properties of the semiconductor. It will also be understood by those having skill in the art that a thin clear inorganic layer, such as silicon nitride (not shown) may be formed and patterned between substrate 10 and first wiring layer 16, to act as a prepatterned lithography layer for the final chip-to-decal-electrical connections or reach-through-vias.

Figure 2B:
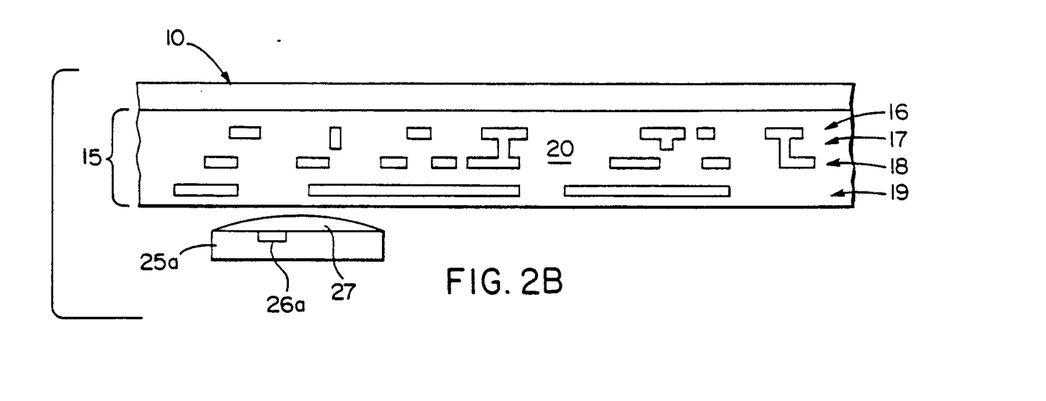

Referring now to FIG. 2B, a first integrated circuit chip 25a is aligned and mechanically attached to the thin film decal 15. It will be understood by those having skill in the art that integrated circuit chip 25a may be a custom-designed or conventional off-the-shelf integrated circuit chip having a plurality of interconnection pads at the top surface thereof, one of which is illustrated at 26a. Substrate 10 is rotated 180° from the position shown in FIG. 2A and is placed over integrated circuit chip 25a. To promote attachment of chip 25a, a surface attachment layer 27 is formed on the top surface of chip 25a. Surface attachment layer 27 preferably comprises an adhesion promotor, for example $\gamma$-aminopropyl-diethoxysiloxane marketed under the designation A-1100 by Petrach Company, on the surface of chip 25a. A very thin (e g. 1000 Å) coating of permanent curable dielectric polyimide (for example DuPont 2525) is formed on the adhesion promotor. A thick coating of soluble polyimide, for example XU-218 manufactured by Ciba Geigy is formed on the permanent polyimide layer. A solvent, for example n-methylpyrollidinone (NMP) may be applied to the soluble polyimide layer to soften the layer. To further promote chip adhesion, it is preferred that the last formed polyimide layer in decal 15 be of a soluble polyimide.

Figure 2C:
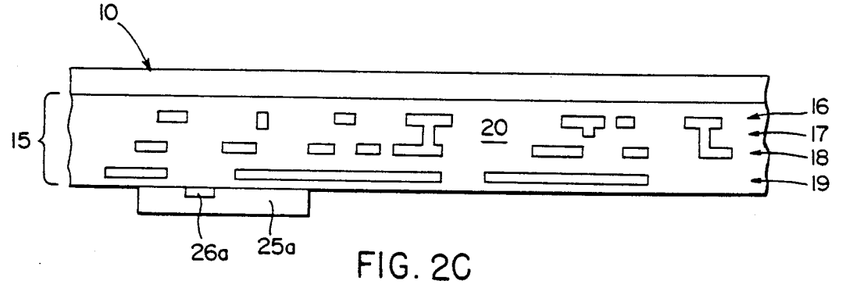

A microscope or other conventional alignment tool, for example a model MA56 contact printer manufactured by Karl-Suss, Munich, Germany, may be employed to align the pads 26a or other alignment marks on integrated circuit chip 25a with wiring layers 16–19 (through windows in the ground plane), or other alignment marks (for example in the ground plane) formed in thin film decal 15. Conventional alignment tools may be employed to align chip 25a to decal 15 to within a 1 $\mu$m tolerance. After alignment, decal 15 is pressed down onto chip 25 to attach the two structures as shown in FIG. 2C. A combination of heat, ultraviolet radiation, vacuum and/or pressure may be employed to remove the residual solvent and harden the soluble polyimide so that chip 25a is firmly attached to decal 15 in an aligned position. These steps may be preferably performed in situ on the contact printer, so that permanent and accurate alignment is assured.

Figure 2D:
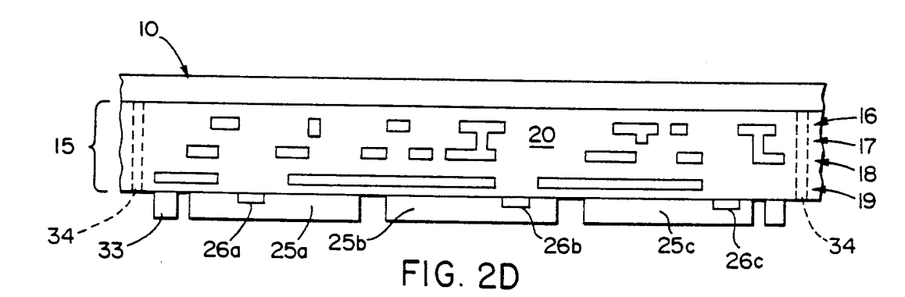

Referring now to FIG. 2D, second and third chips 25b and 25c having connector pads 26b and 26c, respectively thereon are also aligned and attached to thin film decal 15. Thus, according to the invention, chips 25 are "reintegrated" to thin film decal 15 using individual alignment so that alignment tolerances are maintained over the length of thin film decal 15. It will be understood by those having skill in the art that discrete components such as resistors or capacitors may also be "reintegrated" to this film decal 15.

Still referring to FIG. 2D, a support ring 33 is attached to thin film decal 15 surrounding chips 25. Support ring 33 may be attached using the chip attach techniques described above. After all the chips 25 and support ring 33 are attached, the polyimide 20 may be further cured by heating at 230° C. for 30 minutes.

According to the present invention, support ring 33 may be a simple low expansion ceramic, or metal (for example Invar Alloy 42) or other solid material. Ring 33 need not be the same thickness as chips 25, nor need it be on the same side of decal 15 as chips 25. Complex support rings which include internal capacitors, terminating resistors, internal feed through or wiring layers, internal chips or other active devices, and/or external pad or pin connectors may also be employed.

Substrate 10 is then removed, leaving the thin film decal 15 as the sole means of support for chips 25. Many techniques may be employed for removing substrate 10. In one technique, a channel 34 (FIG. 2D) is etched through thin film decal 15 outside support ring 33 down to the surface of the support substrate 10. Then, a dilute solution (10–15%) of buffered hydrofluoric acid (BHF) may be introduced into the channel 34. The BHF naturally runs along the boundary between the thin film wiring decal 15 and support substrate 10 causing a massive adhesion failure therebetween. If needed, the polyimide 20 may be further cured by heating at 230° C. for 30 minutes. Once the substrate 10 is removed, the decal 15 is maintained under tension by the support ring 33.

Figure 2E:
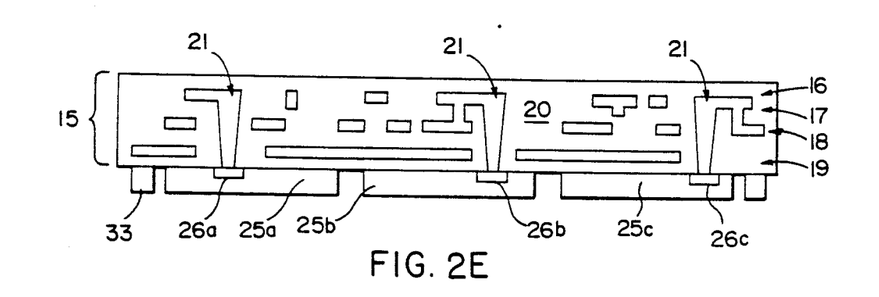

Referring now to FIG. 2E, a plurality of reach-through vias 21 are selectively formed between the appropriate internal wiring layers 16–19 and the appropriate pads 26 on chips 25. Reach through vias 21 may be formed using modified (deep) known techniques for forming internal vias between wiring layers of chip metallization, some of which will be described below in connection with FIG. 6. Vias 21 are "reach-through" vias in that they are formed from a wiring layer in decal 15 to contact the chip pads through the decal. The vias thereby roach through an existing metal and dielectric stack. It will be noted that reach through vias 21 connect the side of the wiring layer which is opposite chips 25, to pads 26. Reach-through-vias from the opposite side of a wiring layer have not heretofore been employed for chip connections. It will also be noted that full surface area chip attachment to decal 15 reduces the mechanical stresses on the electrical connections between the chips and decal, thereby greatly enhancing the reliability of the overall package. In prior art packaging techniques, chip attachment (for example solder balls or bumps) are typically a weak link in the package because all the stresses (thermal and mechanical) are relieved in the electrical connections.

Still referring to FIG. 2E, it will be seen that the structure of the present invention includes thin film decal 15 having at least one wiring layer therein and a support ring 33 attached to the decal for maintaining the decal under tension inside the support ring. At least one integrated circuit chip 25 is attached to the decal inside the support ring in alignment with the decal. A plurality of vias 21 form electrical connections between the wiring layers of the decal and the integrated circuit chips.

Since a support substrate is not used on the front or back, both faces of the extended integration structure may be used for next level package considerations, such as input/output connection and thermal management. For example, solder bumps may be employed on the exposed surface of decal 15 or on the support ring 33 or both. Thermally conductive pistons may be placed adjacent the backs of the chips. Metal foil may be brazed to the ring 33 to hermetically seal off the front and back of the assembly. Other known connection techniques like tape automated bonding or wire bonding may be employed. Moreover, the extended integration structure may be mounted on a still larger extended integration structure using decal-to-decal connection. Alternatively, further metal wiring layers may be formed on the decal 15.

In summary, the extended integration structure may be treated like a very large integrated circuit chip for next level packaging considerations. It should be noted, however, that for next level packaging consideration, the extended integration structure of the present invention is superior to a similarly sized monolithic chip (if such a chip could be made) because stress is relieved at the joints of the separate chips. In contrast, a very large silicon chip would possess large internal stresses, when mounted in a package.

The structure of the present invention also facilitates the replacement of a defective chip without discarding the entire structure. If a chip is found to be defective prior to final cure, the reach-through vias 21 connecting the defective chip to the substrate may be removed. To facilitate reach-through via removal, the reach-through vias may be formed of a different metal than the internal wiring layers. For example, if the internal wiring layers are copper, the vias may be aluminum. The aluminum vias may be removed with an etchant, for example phosphoric/nitric acid, which will not attack copper or polyimide. The bond between the decal and chip may be dissolved, and a new chip may be substituted therefor. Prior to dissolving the bond, the defective chip must be isolated from the remaining chips so that the bond between functional chips and the decal is not dissolved.

Figure 3A:
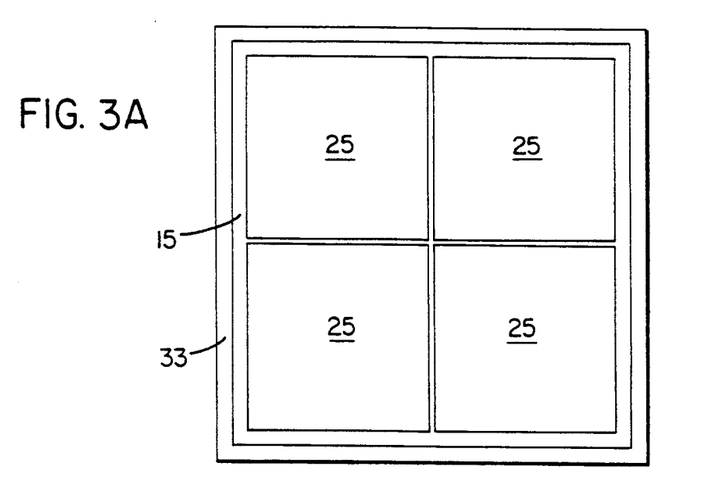
FIGS. 3A-3B illustrate top and side plan views of an extended integration structure according to the present invention.
Figure 3B:
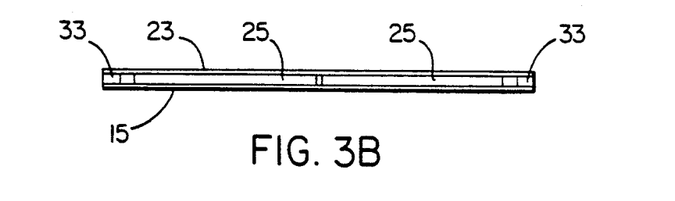

It will be understood by those having skill in the art that the thickness of the layers shown in FIGS. 1 and 2 have been greatly exaggerated in order to illustrate the details of the thin film decal 15. In order to provide a better perspective of the relative dimensions in the extended integration structure of the present invention, FIG. 3 illustrates top and side views of a four chip extended integration structure. Referring now to FIG. 3A, the extended integration structure comprises four chips 25 and support ring 33 all mounted on thin film decal 15. In one embodiment, the chips 25 may be 8 mm square with the gap between adjacent chips being on the order of 0.5 mm. The gap between the chips 25 and support ring 33 may be on the order of 0.5 to several millimeters while the support ring 33 may be several millimeters wide. The total package may be 22-25 mm on a side. Referring to FIG. 3B, the thickness of the chips 25 and support ring 33 may be on the order of 0.5 mm, while the total thickness of the thin film decal 15 may be on the order of 15 μm. An optional foil hermetic seal 23 is also shown attached to support ring 33.

Figure 4:
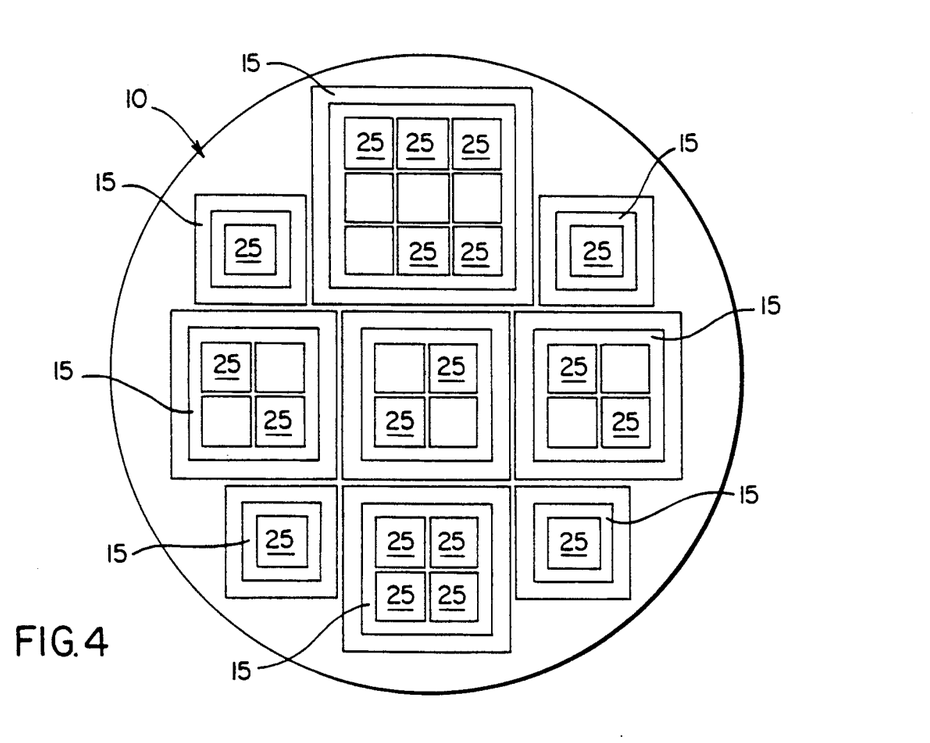
FIG. 4 illustrates a plurality of different size extended integration structures on a wafer size substrate, prior to removal, according to the present invention.
Figure 5A:
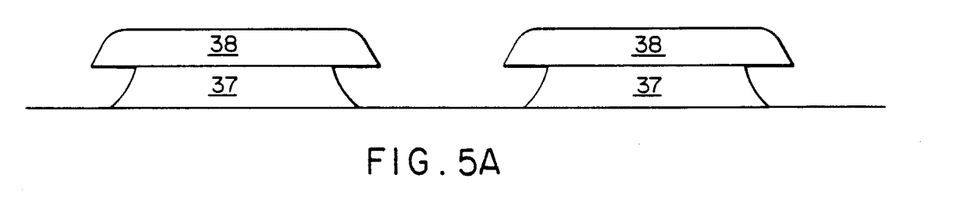
FIGS. 5A-5D illustrate methods of forming thin film wiring layers for an extended integration structure according to the present invention.
Figure 5B:
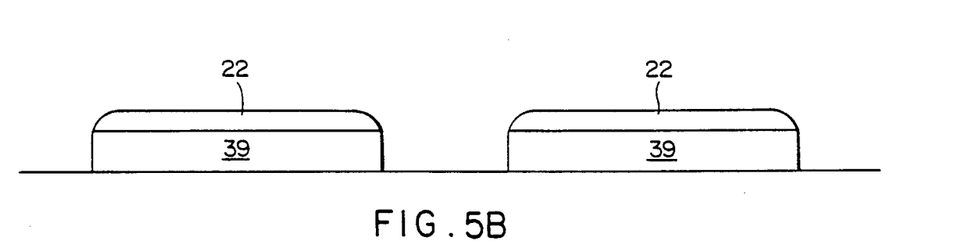
Figure 5C:
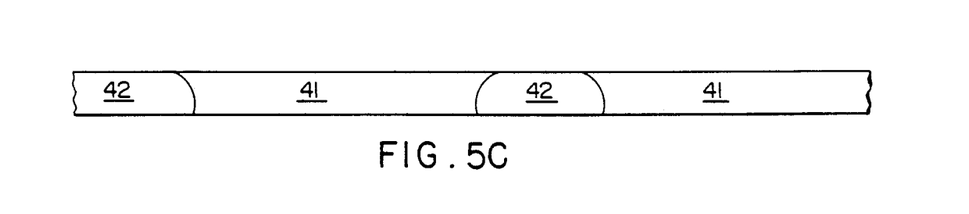
Figure 5D:
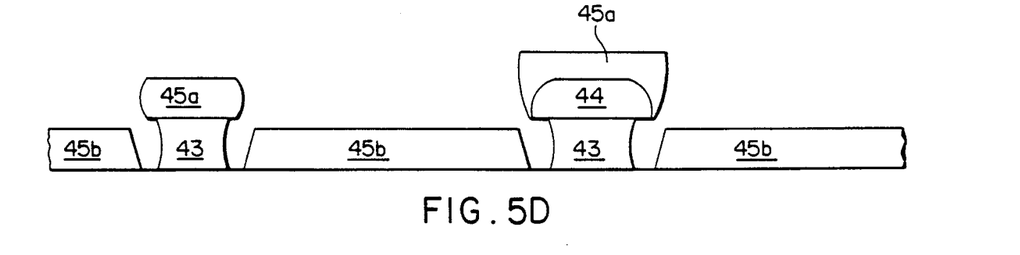

Referring now to FIG. 4, the fabrication of a plurality of different size extended integration structures according to the present invention are illustrated. FIG. 4 illustrates the fabrication of one nine-chip structure, four four-chip structures and four single-chip structures, each surrounded by a support ring 33 and fabricated on a single support substrate 10 according to the present invention. As Was described above, support substrate 10 may be a conventional 100 mm glass substrate. It will be understood by those having skill in the art that the plurality of extended integration structures may be separated into individual extended integration structures by cutting the thin film decal outside the support rings 33.

Referring now to FIG. 5, four techniques for forming internal thin film wiring layers of decal 15 are shown. It Will be understood by those having skill in the art that other conventional metal patterning processes may be employed to form the thin film wiring layers. FIGS. 5A and 5B illustrate subtractive processes for forming patterned metal layers, while FIGS. 5C and 5D illustrate additive processes for forming metal layers. FIG. 5A illustrates a wet etch subtractive process using phosphoric/nitric acid to pattern aluminum layer 37 using a patterned layer of photoresist 38. FIG. 5B illustrates the use of a dry etch or reactive ion etch using $Cl_2$, $BCl_3$ or $SiCl_4$ to etch metal layer 39 through patterned photoresist mask 40. FIG. 5C illustrates an additive plating process in which metal layers (copper) 41 are plated on an underlying metal layer using a mask 42 of photoresist. Finally, FIG. 5D illustrates liftoff processes in which liftoff underlayer 43 and mask layer 44 are defined and a discontinuous metal layer 45a, b is deposited by evaporation. The underlayer 43 is then dissolved, removing the unwanted portion of metal layer 45a thereon, with metal layer 45b remaining. The liftoff method of FIG. 5D is preferred because better quality copper metal may be obtained then by the plating method of FIG. 5C, with a higher aspect ratio (height/width) then may be achieved by the wet etching process of FIG. 5A. Furthermore, the dry etch method of FIG. 5B is not preferred for copper, as the etch product is not volatile at reasonable temperatures. It will be understood by those having skill in the art that other conventional thin film metal patterning processes may also be employed.

Referring now to FIG. 6, a number of techniques for forming reach-through vias 21 for connecting metal wiring layers 16-19 to the connector pads 26 of integrated circuit chip 25 (FIG. 2E) are illustrated. Several of these methods need not be described and illustrated in detail because they are variations of techniques well known to those having skill in the art for chip metallization and decal fabrication. However, it should be noted that these techniques have not heretofore been employed to connect the side of a wiring layer opposite a chip, to the chip pad. FIG. 6A illustrates a reach-through via 21 formed using conventional metallization techniques. A sloped via is first etched into the dielectric 20 which is patterned with thick photoresist. Metal 21 is then evaporated or sputtered into the via creating an electrical contact. Liftoff or wet etch techniques may be employed for the metal patterning. FIG. 6B illustrates a reach-through via 21 which may be "pre" formed as part of the lithography steps of one of the internal wiring layers. FIG. 6C illustrates a "lost wax" reach-through via 21 formed by building up metal layers during the fabrication of each internal wiring layer of thin film decal 15. The built up metal is selectively etched leaving a hole in the dielectric. This thins the dielectric. A final short etch is all that is required to complete the cavity. The metal 21 may then be applied as described in FIG. 6A.

Figure 6A:
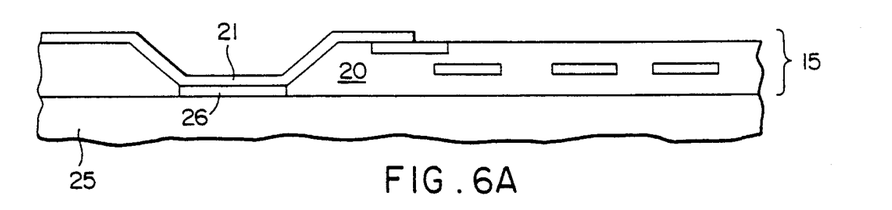
FIGS. 6A–6G illustrate methods of forming reach-through vias for an extended integration structure according to the present invention.
Figure 6B:
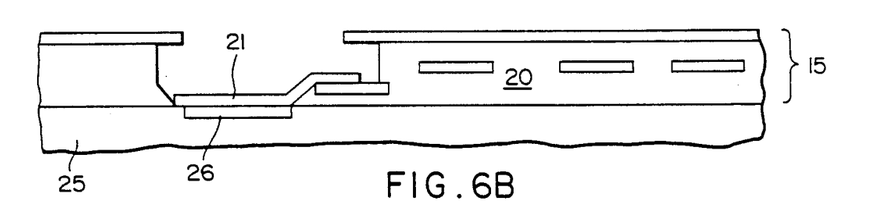
Figure 6C:
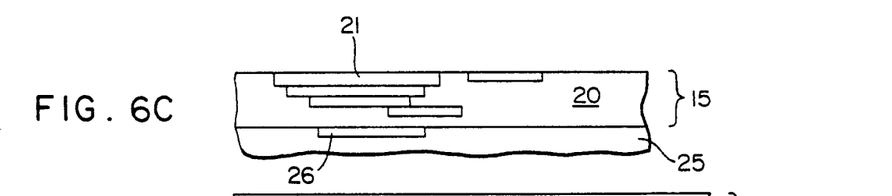
Figure 6D:
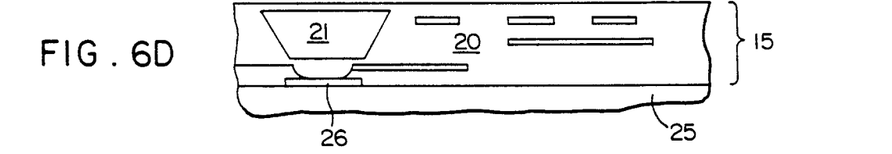

FIG. 6D illustrates a reach-through via 21 in the form of a plug or stud, fabricated using other "lost wax" techniques. After completing the internal levels of metal but prior to removing the substrate 10 a plug 21 may be formed from the bottom side (as illustrated). After chip attach and substrate removal the plug may be removed by etching as described in connection with FIG. 6C and the via completed as described in FIG. 6C. Alternatively, the plug 21 may be a contiguous raised area of substrate 10. After the final dielectric application the surface needs to be planarized prior to chip attach due to build up of polyimide over the plug during processing. A via would be automatically formed as the molded cavity which corresponded to the raised area would be left in place upon the decal removal step.

Figure 6E:
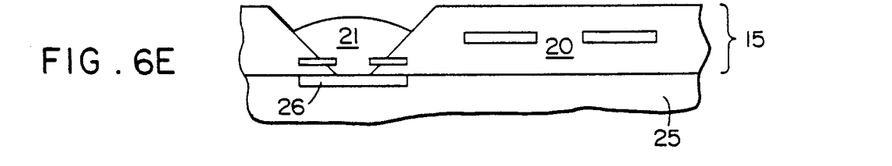
Figures 6F, 6G:
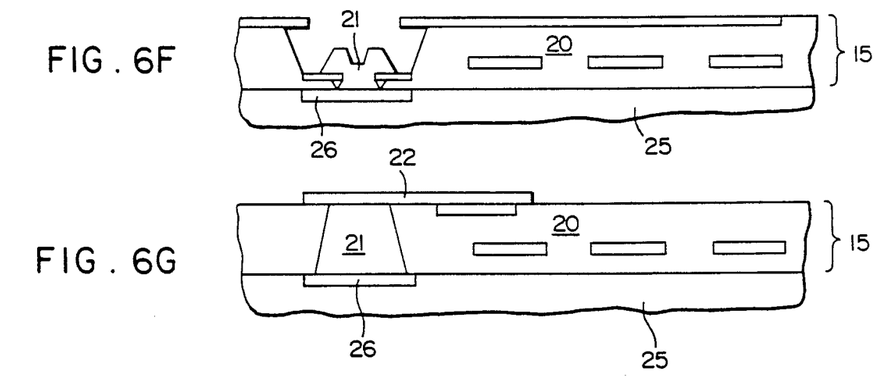

FIG. 6E illustrates a reach-through via from an intermediate layer to pad 26, which may be formed by removing an area around the pad 26 and depositing solder in the removed area. This may be accomplished by dipping in molten solder thereby wetting the exposed Cu lines and gold chip pads 26. FIG. 6F illustrates the use of a liftoff technique to form a central target followed by solder deposit to form vias 21. The solder is deposited through a liftoff mask. The solder is then melted to cause it to flow. The solder 21 is shown in FIG. 6F after evaporation but prior to melting. Finally, FIG. 6G illustrates the formation of a deep stud or post via 21 followed by further contact pattern metallization layer 22. A deep post 21 is formed in an etched hole by evaporation so that it is higher than the surface. The surface is then polished or milled so that the post surface is perfectly planarized. Contact 22 is then completed by an additional metal step.

Figure 7A:
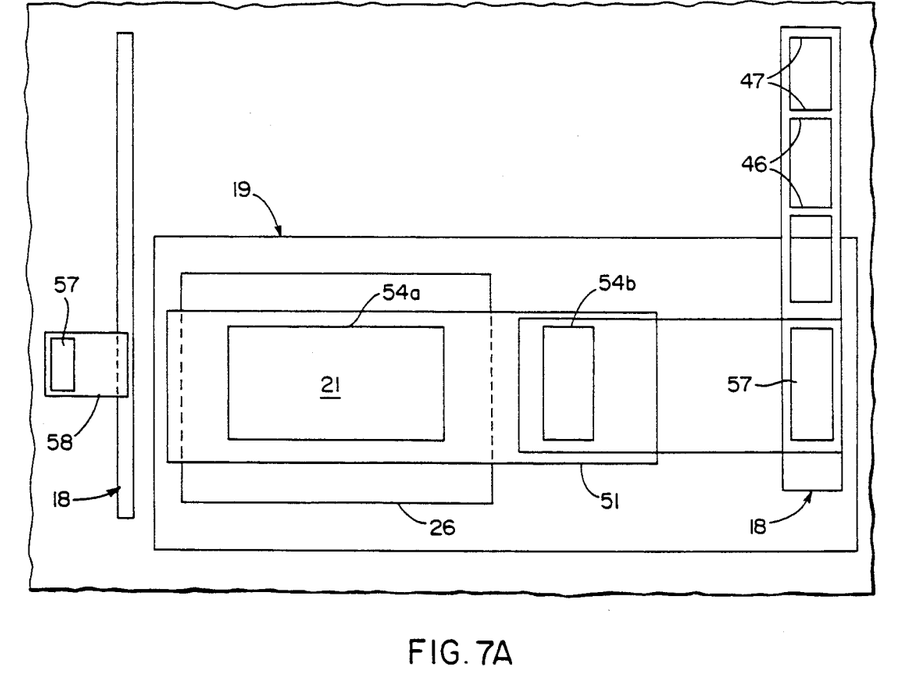
FIGS. 7A–7B illustrate top and side cross-sectional views of one of the reach-through vias of FIG. 6B.
Figure 7B:
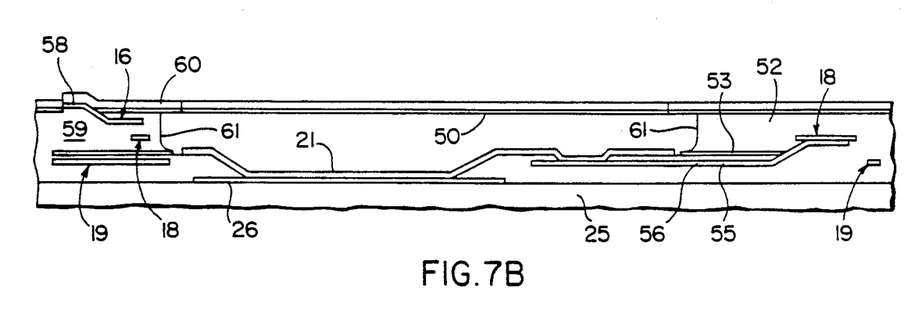

While all of the techniques described in FIG. 6 and other via forming techniques may be employed according to the present invention, the preferred technique is the liftoff via technique of FIG. 6B. FIG. 7 illustrates detailed top and side views (FIGS. 7A and 7B respectively) of the liftoff vias 21 described in FIG. 6B. Referring now to FIG. 7, following application of first insulating layer 11 (FIG. 1B) to substrate 10, a metal or preferably a thermally stable, optically transparent, thin (e.g. 2000 Å) dielectric layer 50 (e.g. silicon nitride or silicon containing polyimide) which is inert to oxygen Reactive Ion Etch (RIE) is deposited and patterned with openings 51 which corresponds to chip pads 26. A polyimide layer 52 is then deposited over this layer. Layers 16 through 18 are sequentially fabricated and optically tested as was described in connection with FIG. 2A. Layer 18 is then overcoated With polyimide dielectric and a second, (thinner than the first layer 50, e.g. 1000 Å) inert dielectric layer 53 is then deposited. Openings 54a, 54b are patterned corresponding to the chip pads 26 and electrically isolated traces 55 (not at ground) which are to be formed in the next metal layer which is the ground plane level 19. A thin polymer dielectric layer 56 is then applied. Via holes 57 are patterned and etched from the location of traces 55 to be formed in the ground layer 19 to conductor lines in layer 18. Ground layer 19 is then formed. An electrically conductive path by means of the ground layer metal step from the proximity of the chip pads 26 to conductive layer 18 is thereby formed. Final substrate and chip preparation and mechanical attachment are then completed as before.

Substrate 10 is then removed by the adhesion failure method previously described. The assembly is then etched by means of oxygen RIE, with the process conditions being dynamically altered during the entire course of the etch. The etch is first performed under anisotropic conditions to clear the first surface unpatterned layer 11 and cut into the body of the dielectric through the prepatterned openings 51 in layer 50. The RIE conditions are slowly changed during the course of the etch from initially anisotropic (vertical profile sidewalls etched in the polyimide) to isotropic (undercut profile sidewalls), as indicated at 61. This is accomplished by changing the pressure and cathode bias in the etch tool. The etch proceeds to etch the polyimide with a pattern corresponding to openings 51 until the inert layer 53 is reached. At this time the RIE conditions are fully isotropic. The etch is stopped by the inert layer except through openings 54a, 54b in inert layer 53. The isotropic conditions cause the polyimide to be etched in such a fashion so that the openings 54a, 54b are undercut. The sidewalls of the polyimide etched under openings 54a, 54b will thereby have gently sloped angles. The RIE conditions are chosen as such so that good metal step coverage will be realized for conductor line 21 without the problem of undercutting opening 51 to a deleterious extent.

When the etch has reached all chip pads 26 the oxygen etch is terminated. A fluorine containing gas (e.g. SF6 or CF4) is then used to completely RIE the inert layer 53 exposed through opening 51 thereby destroying the lower overhung structure. Inert layer 53 was made thinner than inert layer 50 so that an overhung structure remains in place at the top as illustrated in FIG. 7B. Metal is then evaporated into the overhung cavity forming electrical contact 21 between chip pads 26 and metal trace 55. Electrical contact is thereby established from chips 25 to decal conductor layer 18. A second upper ground or power plane 60 is simultaneously fabricated during this last evaporation. It may be fabricated to electrically contact with lines in layer 16 by creating openings 57 in inert layer 50 over subsequently processed metal pads 58 of layer 16 which Were stepped down to just above the level of inert layer 50 by means of vias 59 during the first metal step.

The method described in FIG. 7 is preferred for creating decal to chip contacts as it does not require a lithography step following mechanical chip attachment and because the vertical distance between chip pad and package contact is minimized which allows for a higher area density of contacts to be made.

FIG. 7A also illustrates a reduced capacitance internal wiring line 18. For capacitance sensitive technologies such as MOSFET technology, the internal wiring layers of decal 15 may be formed of a ladder structure illustrated in FIG. 7A. The ladder structure has less capacitance than a solid metal line of the same width. The "rungs" 46 of the ladder form links around open circuits in siderails 47, thus improving the yield. The yields expected of a wide line may be achieved, with the decreased capacitance that would be expected of a narrow line. Ladder lines may be employed in any thin film metallization, for example for chip metallization or decal metallization, where decreased capacitance is desired.

Figure 8:
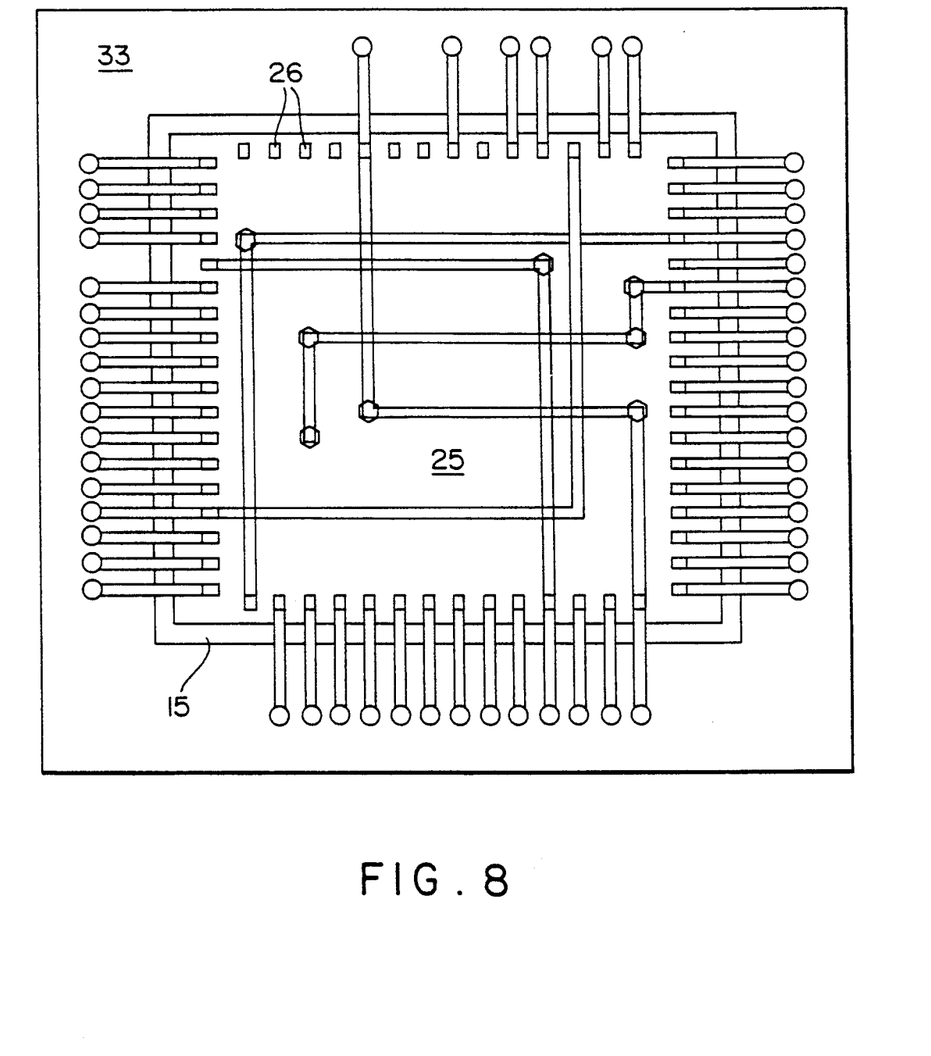
FIG. 8 illustrates a single-chip extended integration structure according to the present invention.

While the present invention may be employed to form an extended integration structure using a plurality of chips, it will also be understood by those having skill in the art that a structure using a single chip may be produced. Such a single chip structure is illustrated in FIG. 8. Referring now to FIG. 8, it will be seen that a single chip 25 and a single mounting ring 33 are employed to redistribute the contacts 26 from chip 25 to form a new input/output (I/O) pattern. The I/O contacts for conventional chip dies are ordinarily arranged for simplest wiring to the periphery of the integrated circuit chip itself, while a system designer usually desires a different wiring pattern. According to the present invention, the extended integration structure may re-orient the fanin/fanout distribution of the chip contacts to form a new chip package having the desired pattern.

According to the present invention an arbitrary size extended integration structure is formed, in a simple and low cost manner, using conventional tools and processes. The extended integration structure of the present invention eliminates the need to use larger and larger chips in an attempt to overcome packaging limitations. Accordingly, it may be foreseen that the present invention will lead to the use of smaller higher yielding chip dies, with the extended integration package including a larger part of the metallization. Of course, large size chips may also be employed, and even wafer size chips may be employed. In a wafer scale integration application the wafer itself may form the support ring, with one or more areas inside the wafer being "re-integrated" according to the present invention. It may also be foreseen that the present invention will change the design of chips themselves, with large chip designs "spilling over" onto a second chip, since the electrical penalty involved in going "off-chip" will no longer be present. The need for on-chip input/output drivers and receivers will also be reduced, since drivers and receivers will not be required for short decal interchip communications. More functionality may thus be provided on the chip, in the chip areas heretofore occupied by drivers and receivers.

Moreover, because of the lower pad size limits of wirebonding and the ever increasing demand for more chip Input/Output pads, many chips are made unnecessarily large with respect to the circuitry they contain for the sole purpose of increasing the chip perimeter size to allow for placement of more bonding pads on a chip. This is wasteful of the surface area of a semiconductor wafer and is therefore economically undesirable. The demand for more Input/Output is driven by the designer's need to establish more and better data pathways between chips so that overall system performance may be enhanced. The present invention will satisfy current demands and will extend far into the future as the Input/Output pad size is on the order of microns (vs the order of mils for wirebonding, solder bumps and tape automated bonding techniques) so that the total number of connections may be made very large (on the order of thousands) for present day state of the art chip size (about 8 mm square).

In the drawings and specification, there have been disclosed typical preferred embodiments of the invention and, although specific terms are employed, they are used in a generic and descriptive sense only and not for purposes of limitation, the scope of the invention being set forth in the following claims.

That which we claim is:

1. An extended integration structure comprising:
   a thin film decal having at least one wiring layer therein;
   a support ring attached to said decal, for maintaining said decal under tension inside said support ring;
   at least one integrated circuit chip attached to said decal inside said support ring, said at least one integrated circuit chip being aligned with said decal; and
   a plurality of electrical connections between said at least one wiring layer and said at least one integrated circuit chip.

2. The structure of claim 1 wherein said thin film decal comprises a plurality of wiring layers insulated from one another and from said at least one integrated circuit chip.

3. The structure of claim 2 wherein said thin film decal further comprises a plurality of vias for selectively connecting said wiring planes to one another.

4. The structure of claim 1 wherein said thin film decal comprises at least one metal wiring layer in polymer insulation.

5. The structure of claim 4 wherein said metal wiring layer is selected from the group consisting of copper and aluminum.

6. The structure of claim 4 wherein said polymer insulation is polyimide.

7. The structure of claim 1 wherein said plurality of electrical connections are reach-through vias.

8. The structure of claim 7 wherein said reach-through vias are metal with said metal wiring layer and said reach-through vias being different metals to facilitate rework of said structure.

9. The structure of claim 1 wherein said support ring is selected from the group consisting of metal and ceramic.

10. The structure of claim 1 wherein said support ring includes input/output connections thereon.

11. The structure of claim 1 wherein said support ring includes at least one capacitor therein.

12. The structure of claim 1 wherein said support ring includes at least one active device therein.

13. The structure of claim 1 wherein said support ring is a semiconductor wafer aligned and attached to said decal, with said semiconductor wafer having active devices fabricated therein, and wherein said extended integration structure further comprises a plurality of electrical connections between said at least one wiring layer and said semiconductor wafer.

14. The structure of claim 1 wherein said thin film decal includes a plurality of input/output connectors thereon.

15. The structure of claim 14 wherein said input/output connectors comprise input/output connectors for tab automated bonding to a next level of packaging.

16. The structure of claim 1 wherein said extended integration structure is mounted on a second extended integration structure.

17. The structure of claim 1 further comprising means for removing heat generated by said at least one integrated circuit.

18. The structure of claim 1 wherein the wires in said wiring layers comprise a ladder structure.

19. The structure of claim 1 further comprising a thermal package connected to at least one of said thin film decal and said at least one integrated circuit chip.

20. The structure of claim 1 further comprising input/output means for connecting at least one of said thin film decal, said support ring and said at least one integrated circuit chip to a next level of packaging.

21. The structure of claim 1 wherein said at least one wiring layer comprises a ladder wiring layer.

22. An integrated circuit structure comprising:
   a thin film decal having at least one wiring layer therein;
   a support ring attached to said decal, for maintaining said decal under tension inside said support ring;
   an integrated circuit chip attached to said decal inside said support ring, said integrated circuit chip being aligned with said decal; and
   a plurality of electrical connections between said at least one wiring layer and said integrated circuit chip, to thereby provide redistributed input/output patterns from said integrated circuit chip.

23. The structure of claim 22 wherein said thin film decal comprises a plurality of wiring layers insulated from one another and from said integrated circuit chip.

24. The structure of claim 23 wherein said thin film decal further comprises a plurality of vias for selectively connecting said wiring planes to one another.

25. The structure of claim 22 wherein said thin film decal comprises at least one metal wiring layer in polymer insulation.

26. The structure of claim 25 wherein said metal wiring layer is selected from the group consisting of copper and aluminum.

27. The structure of claim 25 wherein said polymer insulation is polyimide.

28. The structure of claim 22 wherein said plurality of electrical connections are reach-through vias.

29. The structure of claim 28 wherein said reach-through vias are metal with said metal wiring layer and said reach-through vias being different metals to facilitate rework of said structure.

30. The structure of claim 22 wherein said support ring is selected from the group consisting of metal and ceramic.

31. The structure of claim 22 wherein said support ring includes input/output connections thereon.

32. The structure of claim 22 wherein said support ring includes at least one capacitor therein.

33. The structure of claim 22 wherein said support ring includes at least one active device therein.

34. The structure of claim 22 wherein said thin film decal includes a plurality of input/output connectors thereon.

35. The structure of claim 34 wherein said input/output connectors comprise input/output connectors for tab automated bonding to a next level of packaging.

36. The structure of claim 22 further comprising means for removing heat generated by said at least one integrated circuit.

37. The structure of claim 23 wherein the wires in said wiring layers comprise a ladder structure.

38. The structure of claim 22 further comprising a thermal package connected to at least one of said thin film decal and said integrated circuit chip.

39. The structure of claim 22 further comprising input/output means for connecting at least one of said thin film decal, said support ring and said integrated circuit chip to a next level of packaging.

40. The structure of claim 22 wherein said at least one wiring layer comprises a ladder wiring layer.

41. An electrical connection structure for an electronic device having a pad on the surface thereof comprising:
   a thin film structure on said surface of said electronic device, said thin film structure having a wiring layer therein, with one side of said wiring layer facing said electronic device and the opposite side of said wiring layer facing away from said electrical device; and
   a reach through via electrically connecting said opposite side of said wiring layer to said pad.

42. The structure of claim 41 wherein said reach through via comprises a deposited conductor.

43. The structure of claim 41 wherein said reach through via comprises solder.

44. The structure of claim 41 wherein said reach through via comprises:
   a stud in said thin film structure, electrically connected to said pad; and
   a strap, electrically connecting said stud with said opposite side of said wiring layer.

* * * * *